(12) United States Patent
Niu et al.

(10) Patent No.: US 10,217,851 B2
(45) Date of Patent: Feb. 26, 2019

(54) ARRAY SUBSTRATE AND METHOD OF MANUFACTURING THE SAME, AND DISPLAY DEVICE

(71) Applicant: BOE TECHNOLOGY GROUP CO., LTD., Beijing (CN)

(72) Inventors: Jing Niu, Beijing (CN); Shuang Sun, Beijing (CN); Fangzhen Zhang, Beijing (CN); Dongcan Mi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/707,827

(22) Filed: Sep. 18, 2017

(65) Prior Publication Data

US 2018/0122924 A1 May 3, 2018

(30) Foreign Application Priority Data

Oct. 27, 2016 (CN) .......................... 2016 1 0968576

(51) Int. Cl.
*H01L 29/66* (2006.01)
*H01L 21/443* (2006.01)
(Continued)

(52) U.S. Cl.
CPC ...... *H01L 29/66969* (2013.01); *H01L 21/443* (2013.01); *H01L 21/47635* (2013.01);
(Continued)

(58) Field of Classification Search
CPC .................................................. H01L 21/443
See application file for complete search history.

(56) References Cited

U.S. PATENT DOCUMENTS 9,804,463 B2 * 10/2017 Cao ..................... G02F 1/1368
2007/0103610 A1 * 5/2007 Lee .................. G02F 1/136213
349/38
(Continued)

FOREIGN PATENT DOCUMENTS

| CN | 103579227 A | 2/2014 |
| CN | 103715094 A | 4/2014 |
| CN | 106024706 A | 10/2016 |

OTHER PUBLICATIONS

Chinese Search Report dated May 25, 2017, for corresponding Chinese Application No. 201610968576.6.
(Continued)

*Primary Examiner* — Caridad Everhart
*Assistant Examiner* — Ankush Singal
(74) *Attorney, Agent, or Firm* — Kinney & Lange, P.A.

(57) ABSTRACT

Embodiments of the disclosure provide an array substrate and a manufacturing method thereof, and a display device. The method includes: forming a semiconductor material film, a first insulation material film and a first conductive material film successively on a base substrate, and processing these films through a single patterning process to form an active pattern, a gate insulation pattern and a gate electrode; forming a second insulation layer and forming two contact holes in the second insulation layer and gate insulation pattern; forming a second conductive material film and forming two contact structures from portions of this layer; and forming a third conductive material film, and processing this layer through a single patterning process to form a pixel electrode, and source and drain electrodes being in direct contact with the two contact structures respectively, the pixel electrode and one contact structure being integrated into one piece.

18 Claims, 5 Drawing Sheets

(51) Int. Cl.
  *H01L 21/4763*  (2006.01)
  *H01L 29/786*  (2006.01)
  *H01L 27/12*  (2006.01)

(52) U.S. Cl.
  CPC ...... *H01L 27/1288* (2013.01); *H01L 29/7869* (2013.01); *H01L 29/78618* (2013.01); *H01L 27/1225* (2013.01)

(56) References Cited

U.S. PATENT DOCUMENTS

| | | | | |
|---|---|---|---|---|
| 2009/0278131 | A1* | 11/2009 | Kwon | H01L 27/1255 257/72 |
| 2012/0171822 | A1* | 7/2012 | Yuan | H01L 21/0274 438/166 |
| 2012/0193624 | A1* | 8/2012 | You | H01L 27/124 257/57 |
| 2013/0015457 | A1* | 1/2013 | You | H01L 27/1288 257/71 |
| 2015/0221677 | A1* | 8/2015 | Okabe | G02F 1/1368 349/43 |
| 2015/0221774 | A1* | 8/2015 | Yamazaki | H01L 29/7869 257/43 |
| 2015/0303222 | A1* | 10/2015 | Ning | G02F 1/1368 257/43 |

OTHER PUBLICATIONS

First Chinese Office Action dated Aug. 2, 2017, for corresponding Chinese Application No. 201610968576.6.

\* cited by examiner

ARRAY SUBSTRATE AND METHOD OF MANUFACTURING THE SAME, AND DISPLAY DEVICE

CROSS-REFERENCE TO RELATED APPLICATION

This application claims the benefit of the Chinese Patent Application No. 201610968576. 6 filed on Oct. 27, 2016 in the State Intellectual Property Office of China, the whole disclosure of which is incorporated herein by reference.

BACKGROUND

Technical Field

Embodiments of the present disclosure generally relate to the field of display technologies, and in particular, to a method of manufacturing an array substrate, an array substrate and a display device.

Description of the Related Art

In the field of liquid crystal display, a silicon based material (including amorphous silicon and polysilicon), which has stable characteristics, excellent processability and the like, is generally used as a material for an active pattern of a thin film transistor (TFT). The amorphous silicon has a lower mobility and the poly silicon has a higher mobility, but the thin film transistor made of the polysilicon has a poor uniformity, a low yield and a high unit cost. In recent years, technologies where a transparent oxide semiconductor film is used to manufacture a channel formation region of the thin film transistor and applied in electronic devices and optical devices have attracted considerable attention.

An existing array substrate, which comprises an oxide thin film transistor having a top gate electrode configuration, comprises an active pattern, a gate insulation pattern, a gate electrode, a second insulation layer, a source electrode and a drain electrode, a passivation layer and a pixel electrode formed successively on a base substrate. The source electrode and the drain electrode are each made of a metal material having a smaller resistance, arranged on the second insulation layer, and connected with the active pattern through via holes. The pixel electrode is provided on the passivation layer, and the passivation layer is provided therein with a via hole, through which the pixel electrode is connected with the drain electrode. Further, since the pixel electrode and the drain electrode are arranged with the passivation layer therebetween, a plurality of via holes needs to be provided in the passivation layer for ensuring connection between the pixel electrode and the drain electrode, which is difficult in process. If the pixel electrode is firstly formed and then the drain electrode is directly formed on the pixel electrode such that they are directly connected with each other, eliminating via holes for interconnecting the pixel electrode and the drain electrode, an etching solution used in a subsequent wet etching process made on the pixel electrode will adversely affect the active pattern.

Meanwhile, existing processes of manufacturing an array substrate comprising an oxide thin film transistor include six patterning processes for forming the active pattern, the gate electrode, the second insulation layer and the via hole in the gate insulation pattern, data lines and the source electrode and the drain electrode, the passivation layer, and the pixel electrode respectively. The numerous mask exposure patterning processes will increase difficulty in process of manufacturing the array substrate, and will easily produce defects and lead to reduction in product yield due to insufficient alignment accuracy.

SUMMARY

The present disclosure is provided to overcome at least one of the above and other problems and defects in the prior arts.

According to an embodiment of an aspect of the present disclosure, there is provided a method of manufacturing an array substrate, comprising steps of:

forming a semiconductor material film, a first insulation material film and a first conductive material film successively on a base substrate, and processing the semiconductor material film, the first insulation material film and the first conductive material film through a single patterning process so as to form an active pattern, a gate insulation pattern and a gate electrode;

forming a second insulation layer over the active pattern, the gate insulation pattern and the gate electrode, and forming a first contact hole and a second contact hole through a single patterning process, each of the first contact hole and the second contact hole penetrating through the gate insulation pattern and the second insulation layer so as to expose portions of the active pattern;

forming a second conductive material film with portions thereof being filled into the first contact hole and the second contact hole, and forming an electrically conductive first contact structure and an electrically conductive second contact structure from portions of the second conductive material film, the first contact structure comprising a portion located in the first contact hole and contacting the corresponding exposed portion of the active pattern, the second contact structure comprising a portion located in the second contact hole and contacting the corresponding exposed portion of the active pattern; and forming a third conductive material film to directly cover the second conductive material film and the first contact structure and the second contact structure, and processing the third conductive material film and the second conductive material film through a single patterning process so as to form a pixel electrode, a source electrode and a drain electrode, the source electrode and the drain electrode being in contact with the first contact structure and the second contact structure respectively.

In one embodiment, the second conductive material film is formed from a transparent metal oxide, and the step of forming an electrically conductive first contact structure and an electrically conductive second contact structure from portions of the second conductive material film comprises:

forming a layer of photosensitive insulation film over the second conductive material film, and removing, through a single patterning process, portions of the layer of photosensitive insulation film corresponding to the first contact structure and the second contact structure to be formed, so as to expose portions of the second conductive material film for forming the first contact structure and the second contact structure; and reducing the metal oxide of the portions of the second conductive material film exposed from the layer of photosensitive insulation film into a metal, such that the exposed portion of the second conductive material film corresponding to the first contact hole is formed into the first contact structure and the exposed portion of the second conductive material film corresponding to the second contact hole is formed into the second contact structure.

In one embodiment, the metal oxide forming the second conductive material film is an indium tin oxide, and the method comprises reducing the indium tin oxide of the portions of the second conductive material film exposed from the layer of photosensitive insulation film into indium metal by using a reducing gas.

In one embodiment, the reducing gas includes $H_2$ or $NH_3$.

In one embodiment, the gate insulation pattern and the second insulation layer are made of a same material.

In one embodiment, the pixel electrode and one of the first contact structure and the second contact structure are formed into a one-piece structure.

In one embodiment, the step of processing the semiconductor material film, the first insulation material film and the first conductive material film through a single patterning process so as to form an active pattern, a gate insulation pattern and a gate electrode comprises:

coating a photoresist layer over the first conductive material film;

processing the photoresist layer through exposure and development processes by using a mask so as to form a photoresist pattern, the photoresist pattern comprising a first portion located directly on the gate electrode to be formed and second portions located on either side of the first portion, the first portion having a first thickness, the second portion having a second thickness less than the first thickness;

etching the semiconductor material film, the first insulation material film and the first conductive material film by using the photoresist pattern as a mask so as to form the active pattern and the gate insulation pattern;

removing the second portions of the photoresist layer so as to expose portions of the first conductive material film on either side of the gate electrode to be formed; and etching and removing the portions of the first conductive material film on either side of the gate electrode to be formed by using remained portions of the photoresist layer as a mask, so as to form the gate electrode.

In one embodiment, the mask used for exposure and development processes of the photoresist layer includes a halftone mask, the halftone mask comprising a photoresist fully-remained region corresponding to the first portion, a photoresist half-remained region corresponding to the second portions, and a photoresist fully-removed region which includes other regions of the halftone mask except the photoresist fully-remained region and the photoresist half-remained region.

In one embodiment, the etching of the first conductive material film includes wet etching, the etching of the first insulation material film includes dry etching, and the etching of the semiconductor material film includes wet etching.

According to an embodiment of another aspect of the present disclosure, there is provided an array substrate, comprising: an active pattern, a gate insulation pattern and a gate electrode, which are successively arranged on a base substrate in a stacked configuration; an second insulation layer covering the active pattern, the gate insulation pattern and the gate electrode; a pixel electrode on the second insulation layer; and a source electrode and a drain electrode above the second insulation layer, the array substrate further comprises a first contact structure and a second contact structure provided in the same layer as the pixel electrode, each of the first contact structure and the second contact structure penetrates through the second insulation layer and the gate insulation pattern so as to contact the active pattern, the first contact structure is located below the source electrode, and the second contact structure is located below the drain electrode, and the source electrode is electrically connected with the active pattern via the first contact structure, and the drain electrode is electrically connected with the active pattern and the pixel electrode via the second contact structure.

In one embodiment, the second contact structure and the pixel electrode are formed into a one-piece structure.

In one embodiment, the pixel electrode includes a transparent metal oxide, each of the first contact structure and the second contact structure is a metal structure, and the metal oxide of the pixel electrode has the same metal component as the metal structure.

In one embodiment, the metal oxide includes an indium tin oxide, and the metal structure includes an indium structure.

In one embodiment, the gate insulation pattern is arranged between the gate electrode and the active pattern, an orthographic projection of a portion, which is located directly on the active pattern, of the gate insulation pattern on the base substrate has an area larger than an area of an orthographic projection of the gate electrode on the base substrate and smaller than an area of an orthographic projection of the active pattern on the base substrate.

In one embodiment, the gate insulation pattern only includes portions located directly on the active pattern.

In one embodiment, an area of an orthographic projection of the active pattern on the base substrate is larger than an area of an orthographic projection of the gate electrode on the base substrate.

In one embodiment, orthographic projections of the first contact hole and the second contact hole on the base substrate are located within an orthographic projection of the active pattern on the base substrate.

In one embodiment, orthographic projections of the first contact structure and the second structure hole on the base substrate at least cover orthographic projections of the first contact hole and the second contact hole on the base substrate.

According to an embodiment of a further aspect of the present disclosure, there is provided display device, comprising the array substrate described in any of embodiments of the present disclosure.

DETAILED DESCRIPTION

Figure 1:
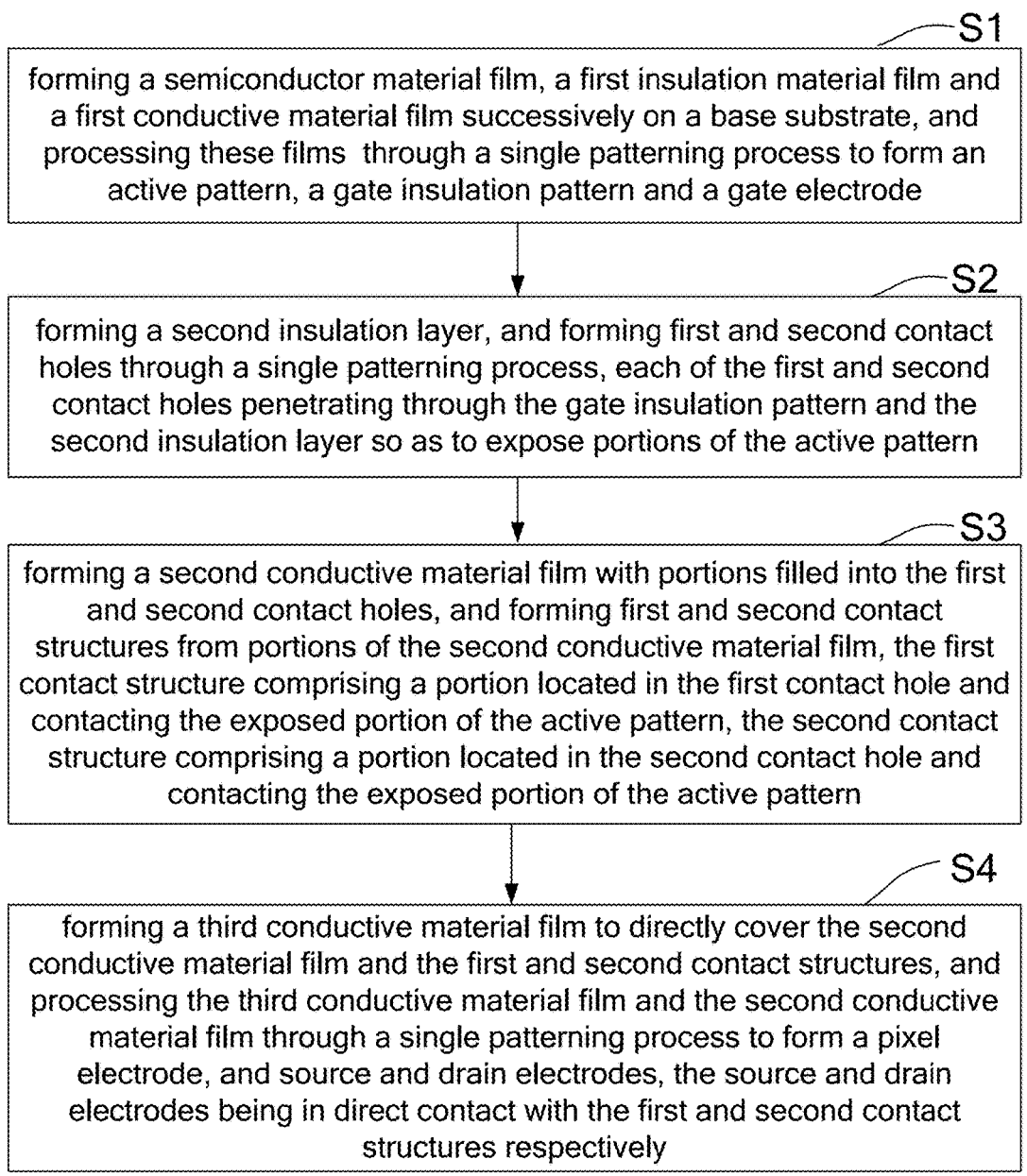
FIG. 1 is a flow chart of a method of manufacturing an array substrate according to an exemplary embodiment of the present disclosure.

In order to make objects, technical schemes and advantages of the present disclosure clearer, the disclosure will be described in further detail with reference to the accompanying drawings. Obviously, the described embodiments are merely a part of embodiments of the disclosure, rather than being all embodiments thereof. Based on the embodiments of the disclosure, all other embodiments arrived at by those ordinary skilled in the art without any inventive step will fall within the scope of the disclosure.

Further, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An embodiment of the present disclosure provides a method of manufacturing an array substrate. With reference to FIG. 1-2H, the method mainly comprises following steps S1-S4:

step S1: forming a semiconductor material film, a first insulation material film and a first conductive material film successively on a base substrate, and processing the semiconductor material film, the first insulation material film and the first conductive material film through a single patterning process so as to form an active pattern, a gate insulation pattern and a gate electrode. In some example, an area of an orthographic projection of the active pattern on the base substrate is larger than an area of an orthographic projection of the gate electrode.

Figure 2A:
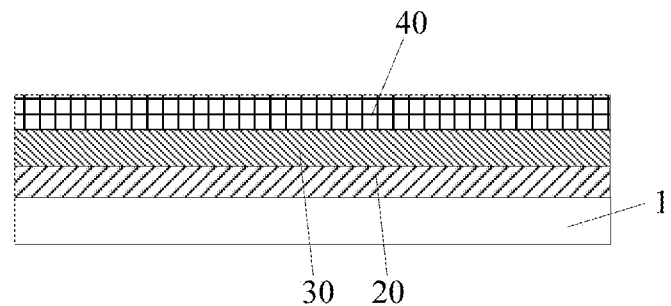
FIG. 2A to FIG. 2I are schematic diagrams showing structures formed after respective steps of a method of manufacturing an array substrate according to an exemplary embodiment of the present disclosure.
Figure 2B:
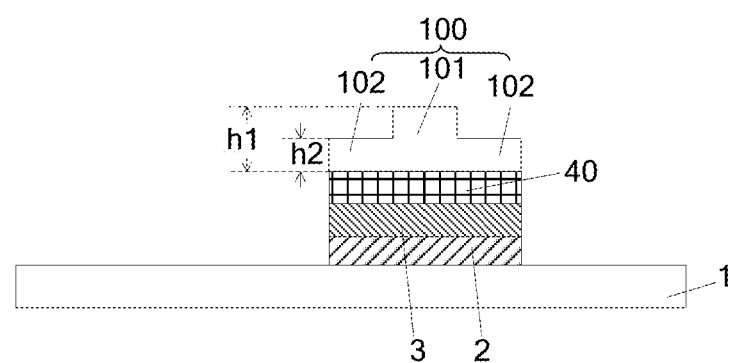
Figure 2C:
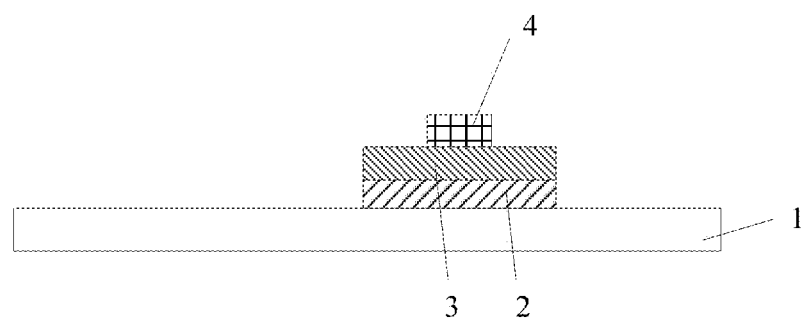

Exemplarily, in this step, a semiconductor material film 20, a first insulation material film 30 and a first conductive material film 40 (for example, a metal film) are firstly deposited successively on a base substrate 1, as shown in FIG. 2A; then, a photoresist layer 100 is coated over the base substrate, and is processed through exposure and development processes so as to form a photoresist pattern, the photoresist pattern comprising a first portion 101 located directly on a gate electrode to be formed and second portions 102 located on either side of the first portion, the first portion 101 having a first thickness h1, the second portion 102 having a second thickness h2 less than the first thickness; thereafter, the semiconductor material film 20, the first insulation material film 30 and the first conductive material film 40 are etched by using the photoresist pattern as a mask, for example, the first conductive material film 40 is wet etched, the first insulation material film 30 is dry etched, and the semiconductor material film is wet etched, so as to obtain a structure of the array substrate shown in FIG. 2B, forming an active pattern 2 (formed from the semiconductor material film) and a gate insulation pattern 3 (formed from the first insulation material film); subsequently, the second portions of the photoresist layer 100 is removed through an ashing process so as to expose a portion of the first conductive material film 40, then the first conductive material film 40 is etched (for example, wet etched) again by using remained photoresist, so as to form a gate electrode 4, and finally the photoresist is removed, obtaining a structure of the array substrate shown in FIG. 2C. In some embodiments, the gate insulation pattern may be only formed directly on the active pattern and does not cover all regions of the base substrate or not cover the whole active pattern. Of course, it may be appreciated that in other embodiments, areas of orthographic projections of the gate insulation pattern and the active pattern on the base substrate may be the same as or different from each other, which depends on the structure of the thin film transistor, process requirements and the like.

In some embodiments, an appropriate mask may be used to perform exposure and development of the photoresist layer. For example, a halftone mask may be used, a region of the mask corresponding to (for example, aligned with, in patterning process) the pattern of the gate electrode 4 to be formed (that is, corresponding to the first portion) is a photoresist fully-remained region, a region of the mask (including a zone corresponding to the second regions) corresponding to (for example, aligned with, in patterning process) portions of the active pattern 2 except a portion thereof located directly below the gate electrode 4, is a photoresist half-remained region, and other region of mask is a photoresist fully-removed region.

Exemplarily, the semiconductor material film may be made of a metal oxide semiconductor material such as Indium Gallium Zinc Oxide (IGZO) or the like. Field effect transistor made of amorphous In—Ga—Zn—O based materials (α-IGZO) with composition elements of indium, gallium, zinc and oxide has a higher mobility and a larger switching ratio, and thus can obtain better performances.

Step S2: forming a second insulation layer, and forming a first contact hole and a second contact hole in the gate insulation pattern and the second insulation layer through a single patterning process so as to expose the active pattern, orthographic projections of the first contact hole and the second contact hole on the base substrate being located within the orthographic projection of the active pattern on the base substrate.

Figure 2D:
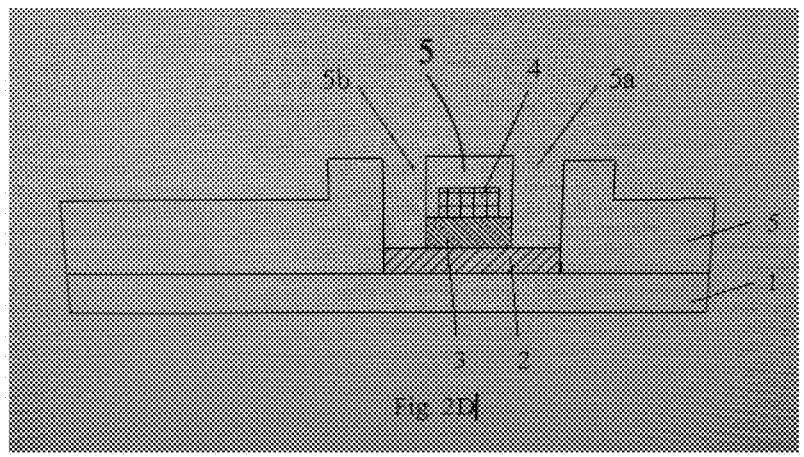

In this step S2, exemplarily, a second insulation layer 5 is firstly formed (for example, deposited) above the base substrate, and a first contact hole 5a and a second contact hole 5b are each formed in the gate insulation pattern 3 and the second insulation layer 5 through a single patterning process so as to expose the active pattern 2, as shown in FIG. 2D. In an exemplary embodiment, as shown in FIG. 2D, an orthographic projection of a portion, which is located directly above the active pattern 2, of the second insulation layer 5 on the base substrate has substantially the same area as an orthographic projection of a portion, which is located directly on the active pattern 2, of the gate insulation pattern 3 on the base substrate 1. The present disclosure, however, is not limited to this, and in other embodiments, their orthographic projection areas may be different from each other, which depends on, for example, specific structures, positions, process requirements or the like of the contact holes, the second insulation layer and the gate insulation pattern. The first contact hole 5a and the second contact hole 5b are located directly above the active pattern 2 and on either side of the gate insulation pattern 3 respectively. In illustrated example, the portion of the second insulation layer 5 located directly above the active pattern 2 covers the whole gate electrode 4 so as to provide better isolation to the gate electrode 4. For example, the second insulation layer 5 has portions located between the gate electrode 4 and the first contact hole 5a and the second contact hole 5b.

In some embodiments, as shown in FIG. 2D, orthographic projections of the first contact hole 5a and the second contact hole 5b on the base substrate 1 are located within the orthographic projection of the active pattern 2 on the base substrate 1 and do not coincide with the orthographic projection of the gate electrode 4 on the base substrate 1, and an orthographic projection of a portion, which is located directly on the active pattern 2, of the gate insulation pattern 3 on the base substrate 1 has an area larger than an area of the orthographic projection of the gate electrode 4 on the base substrate and smaller than an area of the orthographic projection of the active pattern 2 on the base substrate. The present disclosure, however, is not limited to this, and those skilled in the art could understand that this may be adjusted according to the specific structure of the thin film transistor and process requirements.

Shown in FIG. 2C is an example where the first contact hole 5a and the second contact hole 5b are formed at end edges of the gate insulation pattern 3. It will be understood that the first contact hole 5a and the second contact hole 5b may also be formed at non-edge positions of the gate insulation pattern 3, such that portions of the gate insulation pattern 3 at sides of the first contact hole and second contact hole located away from the gate electrode 4 are remained and abut portions of the second insulation layer 5 on either side, for example, the gate insulation pattern has portions located between the second insulation layer and the first contact hole and the second contact hole. Correspondingly, in step S1, the pattern of the mask may be designed such that the area of the orthographic projection of the portion, which is located directly on the active pattern 2, of the gate insulation pattern 3 on the base substrate 1 is between the area of the orthographic projection of the gate electrode 4 on the base substrate and the area of the orthographic projection of the active pattern 2 on the base substrate, which is not particularly limited herein.

In one exemplary embodiment, the gate insulation pattern and the second insulation layer may be made of a same material, which is beneficial in forming the first contact hole 5a and the second contact hole 5b at the same time, which penetrate through the gate insulation pattern 3 and the second insulation layer 5, at a time in the patterning process.

Step S3: forming a second conductive material film, which comprises an electrically conductive first contact structure and an electrically conductive second contact structure being in contact with the active pattern, the first contact structure comprising a portion located within the first contact hole, the second contact structure comprising a portion located within the second contact hole.

Figure 2E:
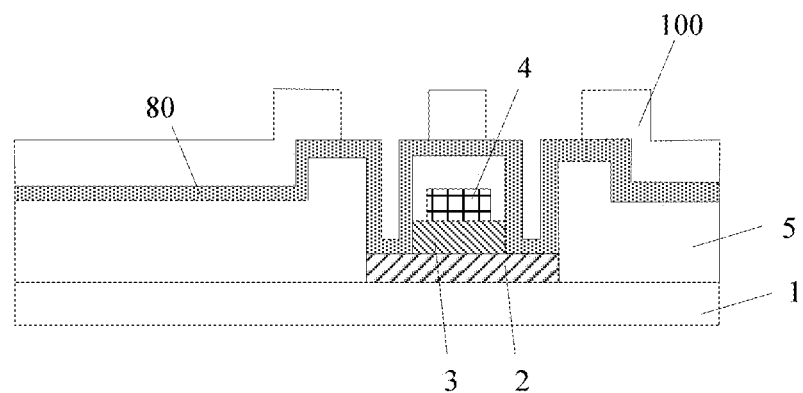
Figure 2F:
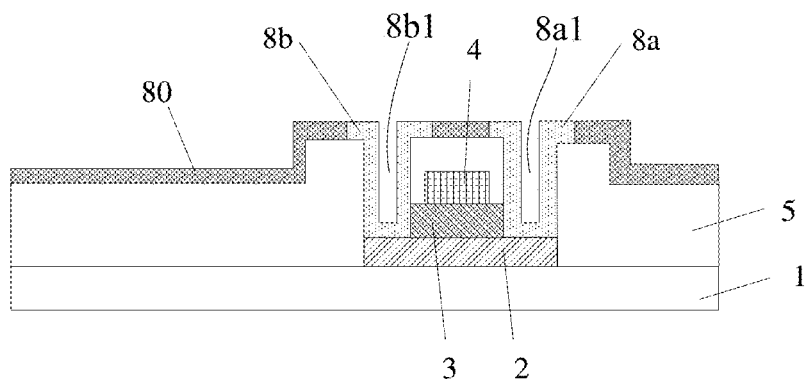

In this step, referring to FIGS. 2E and 2F, portions of the second conductive material film 80 located at either side of the gate electrode 4 are respectively formed into a first contact structure 8a and a second contact structure 8b, the first contact structure 8a comprises a portion located in the first contact hole 5a, and the second contact structure 8b comprises a portion located in the second contact hole 5b. Exemplarily, as shown in the figures, an orthographic projection of the first contact structure 8a on the base substrate 1 fully covers the orthographic projection of the first contact hole 5a on the base substrate, and an orthographic projection of the second contact structure 8b on the base substrate 1 fully covers the orthographic projection of the second contact hole 5b on the base substrate. In an example, the second conductive material film 80 is formed from a transparent conductive material (for example, metal oxide, including ITO).

In some embodiments of the present disclosure, as shown in FIGS. 2E and 2F, the portion of the first contact structure 8a located in the first contact hole 5a has a substantially U shape defining a first center opening or hole 8a1, and the portion of the second contact structure 8b located in the second contact hole 5b has a substantially U shape defining a second center opening or hole 8b1.

In one embodiment, the step of forming the first contact structure 8a and the second contact structure 8b of the second conductive material film 80 may comprise:

forming a layer of photosensitive insulation film over the second conductive material film 80, and removing, through a single patterning process, portions of the layer of photosensitive insulation film corresponding to the first contact hole 5a and the second contact hole 5b; for example, the layer of photosensitive insulation film may be a photoresist layer 100, as shown in FIG. 2E;

reducing the metal oxide of at least the portions of the second conductive material film 80 corresponding to the first contact hole 5a and the second contact hole 5b (including the portions located in the first contact hole 5a and the second contact hole 5b) into a metal, such that the portion of the second conductive material film 80 corresponding to the first contact hole 5a is formed into the conductive first contact structure 8a and the portion of the second conductive material film 80 corresponding to the second contact hole 5b is formed into the conductive second contact structure 8b, the first contact structure 8a comprises a portion located in the first contact hole 5a, and the second contact structure 8b comprises a portion located in the second contact hole 5b, as shown in FIG. 2F. As can be seen from FIG. 2F, the first contact structure 8a and the second contact structure 8b and the pixel electrode 8 (see FIG. 2I) are located in a same layer (that is, the second conductive material film) or formed from a same layer, and the portions of the second conductive material film 80 corresponding to the contact holes 5a and 5b are formed into the first contact structure 8a and the second contact structure 8b through reduction reaction.

Exemplarily, the material from which the second conductive material film 80 is formed may include a transparent metal oxide, for example, indium tin oxide (ITO) or other metal oxide having a certain thickness in a range enabling a transparent state thereof. These metal oxides preferably include an oxidized metal material which can be easily reduced, for example, indium oxide component, so that the indium tin oxide may be reduced into indium metal through a process using reducing gas; in an example, the reducing gas includes H2 or NH3. The layer of photosensitive insulation film may include various materials, which are photosensitive and not electrically conductive, including photoresist, and embodiments of the present disclosure will be described by taking the photoresist layer 100 as an example.

In this step, after completing the pattern of the second insulation layer 5, a transparent second conductive material film 80 and a photoresist layer 100 are formed directly, with portions of the second conductive material film being filled into the contact holes in the second insulation layer 5, and the pattern of the photoresist layer 100 shown in FIG. 2E is obtained through a single patterning process (including exposure, development and the like), where the photoresist layer 100 is formed with openings at positions corresponding to the contact holes in the second insulation layer 5 and to a source electrode 6 and a drain electrode 7 to be formed (see FIG. 2I); then, the portions (metal oxide) located in the contact holes and the portions (metal oxide) located within regions corresponding to the source electrode and the drain electrode to be formed, of the second conductive material film are processed into indium metal having a low resistance by using reducing gas (H2, NH3 or the like), without using any etching process, and then the photoresist layer 100 is directly peeled off, thereby obtaining the structure of the array substrate shown in FIG. 2F having the first contact structure 8a and the second contact structure 8b.

Step S4: forming a third conductive material film over the second conductive material film comprising the first contact structure and the second contact structure, with portions of the third conductive material film being filled into the holes of the first contact structure and the second contact structure, and processing the third conductive material film and the second conductive material film through a single patterning process by using a mask so as to form a pixel electrode, a source electrode and a drain electrode, the source electrode and the drain electrode being located on and in contact with the first contact structure and the second contact structure respectively.

Figure 2G:
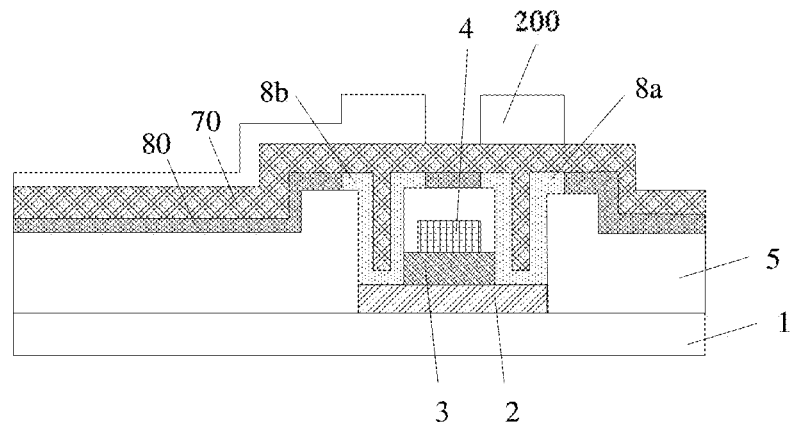
Figure 2H:
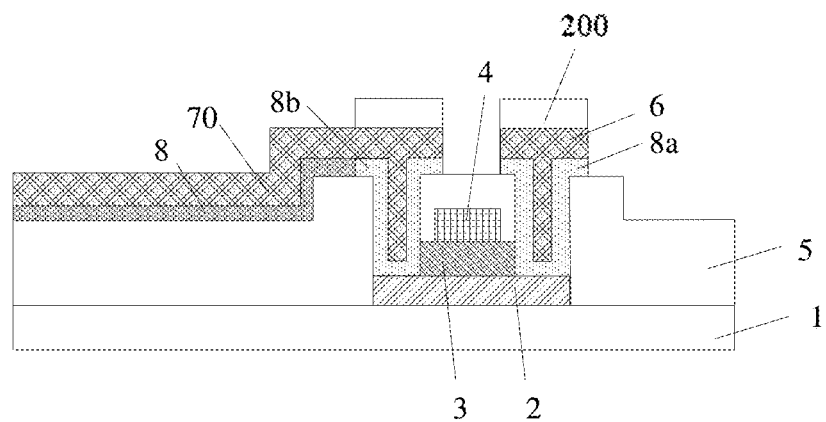
Figure 2I:
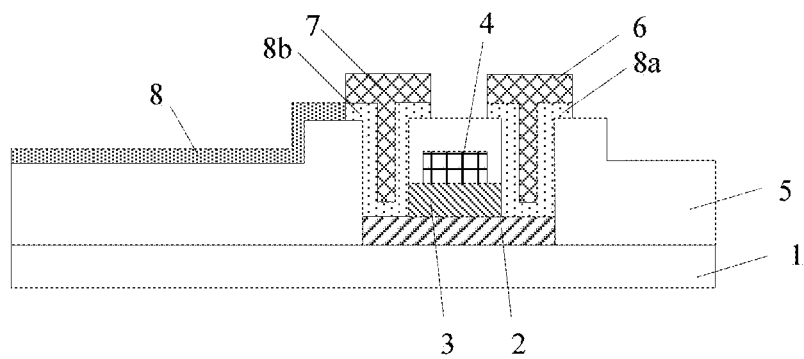

In some embodiments, in the mask used for forming the pixel electrode 8, the source electrode 6 and the drain electrode 7, a region of the mask corresponding to (for example, aligned with or located directly above, in patterning process) the pattern of the source electrode 6 and the drain electrode 7 to be formed is a photoresist fully-remained region, a region of the mask corresponding to the pixel electrode 8 to be formed is a photoresist half-remained region, and other region of mask is a photoresist fully-removed region. As shown in FIG. 2I, the source electrode 6 and the drain electrode 7 are directly formed on the first contact structure 8a and the second contact structure 8b respectively, so that through low resistance of the first contact structure 8a and the second contact structure 8b, a better contact effect between the active pattern 2 and the source electrode 6 and the drain electrode 7 may be provided, and the channel effect of the thin film transistor when being turned on can be ensured.

In this step, the third conductive material film (for example, layer of metal film) 70 may be formed through a sputtering process, such that portions of the third conductive material film 70 are filled into the holes 8a1 and 8b1 of the first contact structure 8a and the second contact structure 8b, and a photoresist layer 200 is formed over the third conductive material film 70, and then the photoresist layer 200, the third conductive material film 70 and the second conductive material film 80 are processed through a single patterning process, thereby obtaining the structure of the array substrate shown in FIG. 2I. Exemplarily, after forming the pattern of the photoresist layer 200 (including portions located directly above the source electrode, the drain electrode and the pixel electrode to be formed) as shown in FIG. 2G, the third conductive material film 70 may be etched (for example, wet etched) and the second conductive material film 80 may be etched (for example, wet etched), such that portions of the third conductive material film 70 and the second conductive material film 80 are removed (for example, portions of the third conductive material film 70 and the second conductive material film 80 except portions thereof located directly below the pattern of the photoresist layer 200 shown in FIG. 2G, including the right portion in the figure and the portion above the gate electrode 4); next, portions (for example, including a portion located directly above the pixel electrode to be formed) of the photoresist layer 100 are removed through an ashing process, thereby obtaining the structure of the array substrate shown in FIG. 2H, where the array substrate has been formed with a pattern of a separate source electrode 6, a pattern of a portion of the pixel electrode and a pattern of a portion of the drain electrode; then, the third conductive material film 70 is again etched (for example, wet etched) by using the remained photoresist layer 100 shown in FIG. 2H as a mask so as to form the drain electrode 7 and the pixel electrode 8, and finally the remained photoresist is removed, thereby obtaining the structure of the array substrate shown in FIG. 2I.

In step S4, the patterns of the source electrode 6, the drain electrode 7 and the pixel electrode 8 are obtained through a single patterning process, and the pixel electrode 8 is electrically connected with the drain electrode 7 via the contact structure 8b (for example, indium metal), thereby avoiding complex processes for providing numerous via holes in a passivation layer in prior arts; meanwhile, the source electrode 6 and the drain electrode 7 are electrically connected with the active pattern 2 via the contact structures 8a, 8b each having a low resistance, thereby ensuring a better contact effect. With this configuration, not only a better electrical connection between the drain electrode 7 and the pixel electrode 8 can be achieved, but also the metal oxide material of the active pattern may be prevented from being corroded by any etching solution when manufacturing the pixel electrode, thereby ensuring stability of characteristics of the active pattern.

It will be understood that the step S4 may further comprise forming a pattern including data lines from other portions the third conductive material film, while forming patterns of the pixel electrode 8, the source electrode 6 and the drain electrode 7, thereby ensuring transmission effect of a data signal from the data line to the source electrode of the thin film transistor.

During the above processes described in embodiments of the present disclosure, the second conductive material film 80 is directly formed (for example, deposited) after completing the pattern of the second insulation layer 5, and materials of the portions of the second conductive material film 80 located in the contact holes and corresponding to the source electrode 6 and the drain electrode 7 are processed through reduction reaction (for example, through gas plasma treatment) so as to obtain a metal material layer (for example, indium) having a lower resistance; then, a third conductive material film 70 is directly formed (for example, deposited) on the processed second conductive material film such that portions of the third conductive material film are filled into the center holes of the first contact structure 8a and the second contact structure 8b, and the third conductive material film 70 and the second conductive material film 80 are processed through a single patterning process, so as to obtain the source electrode 6, the drain electrode 7 and the pixel electrode 8 at the same time, thereby greatly simplifying process steps.

In the method of manufacturing an array substrate including a top gate electrode type thin film transistor according to embodiments of the present disclosure, the active pattern, the gate insulation pattern and the gate electrode are manufactured through a single patterning process by using an appropriate mask (for example, halftone mask), and the source electrode 6, the drain electrode 7 and the pixel electrode 8 are manufactured through a single patterning process by using an appropriate mask (for example, halftone mask), thereby reducing the number of patterning processes (including mask exposure) by two when compared to a conventional manufacturing method. Portions of the second conductive material film located directly below the source electrode and the drain electrode to be formed are processed through reduction reaction so as to be converted into metal structure (e.g., indium) of low resistance, thereby ensuring better ohmic contact between the active pattern and the source electrode and the drain electrode.

A total of four patterning processes are used in the method of manufacturing an array substrate according to embodiments of the present disclosure, which, when compared to six patterning processes in the conventional method, greatly reduces process steps, reduces process complexity and difficulty, simplifies production process, and largely reduces product defects caused due to inaccurate alignment; further, the active pattern may be prevented from being adversely affected, the connection between the drain electrode and the pixel electrode is greatly simplified, and better interlayer contact can be ensured.

Figure 3:
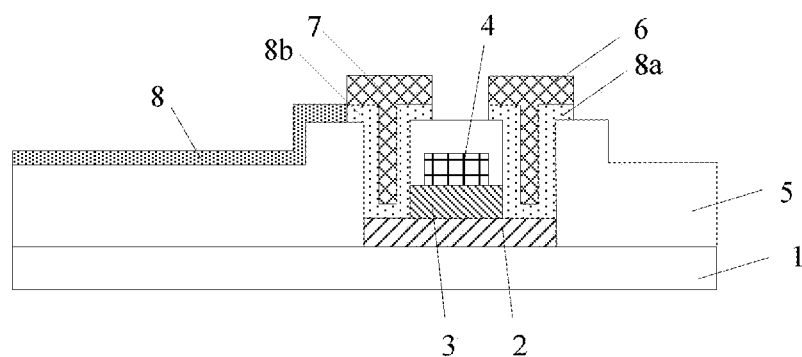
FIG. 3 is structural schematic diagram showing an array substrate according to an exemplary embodiment of the present disclosure.

Further, an embodiment of the present disclosure provides an array substrate. FIG. 3 is a partial cross sectional view showing a structure of an array substrate according to an exemplary embodiment of the present disclosure. As shown in FIG. 3, the array substrate comprises an active pattern 2, a gate insulation pattern 3, a gate electrode 4, a second insulation layer 5, a pixel electrode 8, and a source electrode 6 and a drain electrode 7 located in a same layer, which are successively arranged on a base substrate 1 in a stacked configuration; the array substrate further comprises a first contact structure 8a and a second contact structure 8b, which are electrically conductive (for example, metal), located below the source electrode 6 and the drain electrode 7, and arranged in the same layer as the pixel electrode 8 (the pixel electrode 8, the first contact structure 8a and the second contact structure 8b are formed simultaneously), that is, the first contact structure 8a and the second contact structure 8b and the pixel electrode 8 are arranged in a same layer or formed from a same layer; the source electrode 6 is electrically connected with the active pattern 2 via the first contact structure 8a, and the drain electrode 7 is electrically connected with the active pattern 2 and the pixel electrode 8 via the second contact structure 8b. The array substrate has a simple structure, and can reduce process complexity and reduce product defects caused due to inaccurate interlayer alignment of the contact holes.

Exemplarily, the pixel electrode 8 includes a transparent metal oxide, and the first contact structure 8a and the second contact structure 8b include metal; the metal oxide of the pixel electrode 8 contains the same metal component as the first contact structure 8a and the second contact structure 8b. For example, the transparent metal oxide of forming the pixel electrode 8 may be indium tin oxide, and the metal of the first contact structure 8a and the second contact structure 8b may be indium. Of course, the transparent metal oxide of forming the pixel electrode 8 may also include other metal oxide having a certain thickness in a range enabling a transparent state thereof. These metal oxides preferably include an oxidated metal material which can be easily reduced, for example, indium oxide component, so that the indium tin oxide may be reduced into indium metal through a process using reducing gas.

In some embodiments, the gate insulation pattern 3 is arranged between the gate electrode 4 and the active pattern 2, and an orthographic projection of a portion, which is located directly on the active pattern 2, of the gate insulation pattern 2 on the base substrate 1 has an area larger than an area of an orthographic projection of the gate electrode 4 on the base substrate and smaller than an area of an orthographic projection of the active pattern 2 on the base substrate, such that the gate insulation pattern 3 covers a portion of the active pattern 2 from above, thereby facilitating contacting of the active pattern 2 with the source electrode 6 and the drain electrode 7 located above the gate insulation pattern 3. Compared to the thin film transistor of a conventional array substrate, the array substrate provided according to embodiments of the present disclosure comprises metal contact structure (for example, indium), which is located below both the source electrode and the drain electrode and through which the source electrode and the drain electrode are electrically connected with the active pattern and the pixel electrode respectively, thereby ensuring better contact effect between the active pattern and the source electrode and the drain electrode.

In the array substrate comprising a top gate electrode type thin film transistor according to embodiments of the present disclosure, the active pattern is made of a metal oxide semiconductor material and thus has better characteristics, ensuing better characteristics (including switching characteristic) of the thin film transistor and thereby ensuring performances of the array substrate. Meanwhile, the array substrate has a simple structure and better interlayer contact performance.

An embodiment of the present disclosure further provides a display device, comprising the array substrate described above in any embodiment or the array substrate formed by the method described above in any embodiment.

Exemplarily, the display device may be any product or component which has a display function, such as a liquid crystal panel, an electronic paper, an OLED panel, a mobile phone, a tablet computer, a television, a display, a laptop, a digital photo frame, a navigator or the like.

The display device comprises the above array substrate and thus has a better display performance.

It should be appreciated that the above described contents are only exemplary embodiments for illuminating inventive concepts of the present disclosure, and are not intended to limit the present disclosure. Various changes or modifications may be made by those skilled in the art without departing from the principle and spirit of the present disclosure and shall fall within the scope of the present disclosure.

What is claimed is:

1. A method of manufacturing an array substrate, comprising steps of:

forming a semiconductor material film, a first insulation material film and a first conductive material film successively on a base substrate, and processing the semiconductor material film, the first insulation material film and the first conductive material film through a single patterning process so as to form an active pattern, a gate insulation pattern and a gate electrode;

forming a second insulation layer over the active pattern, the gate insulation pattern and the gate electrode, and forming a first contact hole and a second contact hole through a single patterning process, each of the first contact hole and the second contact hole penetrating through the gate insulation pattern and the second insulation layer so as to expose portions of the active pattern;

forming a second conductive material film with portions thereof being filled into the first contact hole and the second contact hole, and forming an electrically conductive first contact structure and an electrically conductive second contact structure from portions of the second conductive material film, the first contact structure comprising a portion located in the first contact hole and contacting the corresponding exposed portion of the active pattern, the second contact structure comprising a portion located in the second contact hole and contacting the corresponding exposed portion of the active pattern; and forming a third conductive material film to directly cover the second conductive material film and the first contact structure and the second contact structure, and processing the third conductive material film and the second conductive material film through a single patterning process so as to form a pixel electrode, a source electrode and a drain electrode, the source electrode and the drain electrode being in direct contact with the first contact structure and the second contact structure respectively, wherein the second conductive material film is formed from a transparent metal oxide, and the step of forming an electrically conductive first contact structure and an electrically conductive second contact structure from portions of the second conductive material film comprises:

forming a layer of photosensitive insulation film over the second conductive material film, and removing, through a single patterning process, portions of the layer of photosensitive insulation film corresponding to the first contact structure and the second contact structure to be formed, so as to expose portions of the second conductive material film for forming the first contact structure and the second contact structure; and reducing the metal oxide of the portions of the second conductive material film exposed from the layer of photosensitive insulation film into a metal, such that the exposed portion of the second conductive material film corresponding to the first contact hole is formed into the first contact structure and the exposed portion of the second conductive material film corresponding to the second contact hole is formed into the second contact structure.

2. The method according to claim 1, wherein the metal oxide forming the second conductive material film is an indium tin oxide, and the method comprises reducing the indium tin oxide of the portions of the second conductive material film exposed from the layer of photosensitive insulation film into indium metal by using a reducing gas.

3. The method according to claim 2, wherein the reducing gas includes H2 or NH3.

4. The method according to claim 1, wherein the gate insulation pattern and the second insulation layer are made of a same material.

5. The method according to claim 1, wherein the gate insulation pattern and the second insulation layer are made of a same material.

6. The method according to claim 2, wherein the pixel electrode and one of the first contact structure and the second contact structure are formed into a one-piece structure.

7. The method according to claim 1, wherein the step of processing the semiconductor material film, the first insulation material film and the first conductive material film through a single patterning process so as to form an active pattern, a gate insulation pattern and a gate electrode comprises:

coating a photoresist layer over the first conductive material film;

processing the photoresist layer through exposure and development processes by using a mask so as to form a photoresist pattern, the photoresist pattern comprising a first portion located directly on the gate electrode to be formed and second portions located on either side of the first portion, the first portion having a first thickness, the second portions having a second thickness less than the first thickness;

etching the semiconductor material film, the first insulation material film and the first conductive material film by using the photoresist pattern as a mask so as to form the active pattern and the gate insulation pattern;

removing the second portions of the photoresist layer so as to expose portions of the first conductive material film on either side of the gate electrode to be formed; and etching and removing the portions of the first conductive material film on either side of the gate electrode to be formed by using remained portions of the photoresist layer as a mask, so as to form the gate electrode.

8. The method according to claim 7, wherein the mask used for exposure and development processes of the photoresist layer includes a halftone mask, the halftone mask comprising a photoresist fully-remained region corresponding to the first portion, a photoresist half-remained region corresponding to the second portions, and a photoresist fully-removed region which includes other regions of the halftone mask except the photoresist fully-remained region and the photoresist half-remained region.

9. The method according to claim 7, wherein the etching of the first conductive material film includes wet etching, the etching of the first insulation material film includes dry etching, and the etching of the semiconductor material film includes wet etching.

10. An array substrate, comprising:

an active pattern, a gate insulation pattern and a gate electrode, which are successively arranged on a base substrate in a stacked configuration;

a second insulation layer covering the active pattern, the gate insulation pattern and the gate electrode;

a pixel electrode on the second insulation layer; and a source electrode and a drain electrode above the second insulation layer, wherein:

the array substrate further comprises a first contact structure and a second contact structure provided in the same layer as the pixel electrode, each of the first contact structure and the second contact structure penetrates through the second insulation layer and the gate insulation pattern so as to contact the active pattern, the first contact structure is located below the source electrode, and the second contact structure is located below the drain electrode, and the source electrode is electrically connected with the active pattern via the first contact structure, and the drain electrode is electrically connected with the active pattern and the pixel electrode via the second contact structure, wherein the pixel electrode includes a transparent metal oxide, each of the first contact structure and the second contact structure is a metal structure, and the metal oxide of the pixel electrode has the same metal component as the metal structure.

11. The array substrate according to claim 10, wherein the second contact structure and the pixel electrode are formed into a one-piece structure.

12. The array substrate according to claim 10, wherein the metal oxide includes indium tin oxide, and the metal structure includes an indium structure.

13. The array substrate according to claim 10, wherein:

the gate insulation pattern is arranged between the gate electrode and the active pattern, and an orthographic projection of a portion, which is located directly on the active pattern, of the gate insulation pattern on the base substrate has an area larger than an area of an orthographic projection of the gate electrode on the base substrate and smaller than an area of an orthographic projection of the active pattern on the base substrate.

14. The array substrate according to claim 13, wherein the gate insulation pattern only includes portions located directly on the active pattern.

15. The array substrate according to claim 10, wherein an area of an orthographic projection of the active pattern on the base substrate is larger than an area of an orthographic projection of the gate electrode on the base substrate.

16. The array substrate according to claim 10, wherein orthographic projections of the first contact hole and the second contact hole on the base substrate are located within an orthographic projection of the active pattern on the base substrate.

17. The array substrate according to claim 10, wherein orthographic projections of the first contact structure and the second contact structure on the base substrate at least cover orthographic projections of the first contact hole and the second contact hole on the base substrate.

18. A display device, comprising the array substrate of claim 10.

* * * * *